United States Patent
Xiong et al.

(10) Patent No.: US 11,292,255 B2
(45) Date of Patent: Apr. 5, 2022

(54) THIN-FILM PIEZOELECTRIC ACTUATOR

(71) Applicant: SAE MAGNETICS (H.K.) LTD., Hong Kong (CN)

(72) Inventors: Wei Xiong, Hong Kong (CN); Fei He, Hong Kong (CN); Atsushi Iijima, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 0 days.

(21) Appl. No.: 16/616,213

(22) PCT Filed: Jul. 15, 2017

(86) PCT No.: PCT/CN2017/093064
§ 371 (c)(1),
(2) Date: Nov. 22, 2019

(87) PCT Pub. No.: WO2019/014799
PCT Pub. Date: Jan. 24, 2019

(65) Prior Publication Data
US 2020/0189279 A1     Jun. 18, 2020

(51) Int. Cl.
*B41J 2/14*    (2006.01)
*H01L 41/047*  (2006.01)
*H01L 41/09*   (2006.01)

(52) U.S. Cl.
CPC ........ *B41J 2/14233* (2013.01); *H01L 41/047* (2013.01); *H01L 41/0973* (2013.01);
(Continued)

(58) Field of Classification Search
None
See application file for complete search history.

(56) References Cited

U.S. PATENT DOCUMENTS 5,856,837 A    1/1999  Kitahara et al.
6,447,106 B1 *  9/2002  Watanabe ............ B41J 2/14233
                                                      347/70
(Continued)

FOREIGN PATENT DOCUMENTS

CN    101544113    9/2009
CN    102970000    3/2013

OTHER PUBLICATIONS

International Search Report for PCT/CN2017/093064 dated Apr. 19, 2018, 5 pages.
(Continued)

*Primary Examiner* — Erica S Lin
(74) *Attorney, Agent, or Firm* — Nixon & Vanderhye, P.C.

(57) ABSTRACT

A piezoelectric device comprises a pressure chamber forming layer, a vibration plate disposed on and connected with the pressure chamber forming layer to form a pressure chamber, and a piezoelectric element disposed on the vibration plate and used for driving the vibration plate to move and thus changing a volume of the pressure chamber, wherein the piezoelectric element is disposed on the vibration plate in such a manner as to cover a portion of the pressure chamber, the piezoelectric element has two opposite ends respectively extending beyond an edge of the pressure chamber and covering the pressure chamber forming layer. The piezoelectric device of the present invention can efficiently actuate the vibration plate, eliminate undesired displacements of the vibration plate in the opposite direction at the edge of the chamber, and provide higher displacement sensitivity to driving voltage.

20 Claims, 5 Drawing Sheets

(52) U.S. Cl.
CPC ............... *B41J 2002/14241* (2013.01); *B41J 2002/14491* (2013.01)

(56) References Cited

U.S. PATENT DOCUMENTS

| | | | |
|---|---|---|---|
| 8,118,412 B2 | 2/2012 | Shimada | |
| 2005/0212867 A1* | 9/2005 | Nagashima | B41J 2/14233 347/71 |
| 2005/0285911 A1* | 12/2005 | Sugahara | B41J 2/14233 347/71 |
| 2006/0044358 A1* | 3/2006 | Mita | B41J 2/14233 347/68 |
| 2007/0130740 A1* | 6/2007 | Mita | B41J 2/1623 29/25.35 |
| 2009/0244209 A1 | 10/2009 | Shimada | |
| 2012/0212546 A1* | 8/2012 | Yokoyama | H01L 41/047 347/68 |
| 2013/0057355 A1 | 3/2013 | Yoshida | |

OTHER PUBLICATIONS

Written Opinion of the ISA for PCT/CN2017/093064 dated Apr. 19, 2018, 3 pages.

\* cited by examiner

THIN-FILM PIEZOELECTRIC ACTUATOR

This application is the U.S. national phase of International Application No. PCT/CN2017/093064 filed Jul. 15, 2017 which designated the U.S. and the entire contents of which are hereby incorporated by reference.

FIELD OF THE INVENTION

The present invention relates to a piezoelectric device and more particularly to a thin film piezoelectric actuator for MEMS (Micro Electro Mechanical System) membrane structure.

BACKGROUND OF THE INVENTION

Piezoelectric elements are widely used as drive elements and applied in various fields such as MEMS structure inkjet, micro pump, micro mirror and PMUT (Piezo Micromachined Ultrasonic Transducer), because the piezoelectric elements may be deformed when an electrical field is applied.

For example, a vibration plate of an inkjet printing head may constitute a part of a wall of an ink chamber, and the ink chamber may be in communication with a nozzle orifice that ejects ink droplets. In the case that a thin film piezoelectric element is arranged on the vibration plate, the thin film piezoelectric element may be deformed to expand or contract when an electrical field is applied, thereby driving the vibration plate to move and changing the volume of the ink chamber to eject ink droplets through the nozzle orifice.

However, in existing devices with such structure, undesired displacements in the opposite direction at the edge of the chamber are detected. As shown in FIGS. 1A and 1B, since the edge of the vibration plate 102 is constrained by the chamber forming layer 104 and thus cannot be displaced, in the case that the thin film piezoelectric element 103 is deformed to expand or contract when an electrical field is applied, the vibration plate 102 which constitutes a part of a wall of the chamber 101 will move upwards or downwards. In such case, during the upward or downward movement, since the vibration plate 102 is not strong enough to hold the edge of the thin film piezoelectric element 103 disposed in the center, the edge of the thin film piezoelectric element 103 can move freely when the thin film piezoelectric element 103 is deformed to expand or contract, which results in undesired displacements 105 in the opposite direction at the edge portion of the vibration plate 102 around the thin film piezoelectric element 103, i.e., at the edge portion of the vibration plate 102 which is not covered by the thin film piezoelectric element 103, as shown in FIG. 1C.

Such undesired displacements can affect the reliability of the device, make it difficult to achieve precise control of the change amount of the chamber volume, and disturb the accuracy of both ink jetting position and ink jetting amount. Thus, it is desired to provide a piezoelectric device which can eliminate undesired displacements of the vibration plate in the opposite direction.

SUMMARY OF THE INVENTION

The present invention aims to provide a piezoelectric device, which can efficiently actuate the vibration plate, eliminate undesired displacements of the vibration plate in the opposite direction at the edge of the chamber, and provide higher displacement sensitivity to driving voltage.

To this end, the present invention provides a piezoelectric device, which comprises a pressure chamber forming layer, a vibration plate disposed on and connected with the pressure chamber forming layer to form a pressure chamber, and a piezoelectric element disposed on the vibration plate and used for driving the vibration plate to move and thus changing a volume of the pressure chamber, wherein the piezoelectric element is disposed on the vibration plate in such a manner as to cover a portion of the pressure chamber, the piezoelectric element has two opposite ends respectively extending beyond an edge of the pressure chamber and covering the pressure chamber forming layer.

When an electrical field is applied, the piezoelectric element is deformed to expand or contract, thereby driving the vibration plate to move upwards or downwards. In such case, since two opposite ends of the piezoelectric element cover the pressure chamber forming layer, the two opposite ends of the piezoelectric element and the vibration plate can be efficiently held by the pressure chamber forming layer located below. In this way, when the piezoelectric element is deformed to expand or contract, the two ends of the piezoelectric element have no displacement in the direction opposite to the direction in which the middle portion or main portion of the piezoelectric element is displaced, and the piezoelectric element can be integrally displaced in the same direction, whereby the whole vibration plate can be integrally driven to move upwards or downwards depending on the expansion or contraction deformation of the piezoelectric element. In such case, undesired displacements of the vibration plate in the opposite direction can be eliminated, and the displacement sensitivity can be increased.

Preferably, the pressure chamber may have a length greater than a width thereof, and a connecting line connecting two opposite ends and a width direction of the pressure chamber form an angle greater than zero. Since the movement performance of the whole vibration plate is more of longitudinal feature dominated, in the case that the piezoelectric element is disposed in such a manner that a connecting line connecting two opposite ends thereof and a width direction of the pressure chamber form an angle greater than zero and the two ends respectively extending beyond an edge of the pressure chamber and covering the pressure chamber forming layer can be efficiently held by the pressure chamber forming layer, undesired displacements of the vibration plate in the opposite direction can be better eliminated, and the displacement sensitivity can be increased.

Furthermore, the connecting line connecting two opposite ends and the length direction of the pressure chamber form an angle A less than 20 degrees. With such arrangement, undesired displacements of the vibration plate in the opposite direction may be better eliminated, and the displacement sensitivity can be increased.

Furthermore, the connecting line connecting the two opposite ends is parallel to the length direction of the pressure chamber. Since the movement performance of the whole vibration plate is more of longitudinal feature dominated, in the case that the piezoelectric element is disposed in such a manner that the connecting line connecting the two opposite ends is parallel to the length direction of the pressure chamber and the two ends respectively extending beyond an edge of the pressure chamber and covering the pressure chamber forming layer can be efficiently held by the pressure chamber forming layer, undesired displacements of the vibration plate in the opposite direction are eliminated to a great extent, and the displacement sensitivity can be increased.

In particular, the pressure chamber may be elongated or oval shaped.

Alternatively, the pressure chamber may have a length equal to a width thereof. In particular, the pressure chamber may be a square or a circle.

Preferably, the piezoelectric element may cover a central point of the pressure chamber. In such case, undesired displacements of the vibration plate in the opposite direction may be better eliminated, and higher displacement sensitivity can be provided.

Preferably, the vibration plate may be made from anyone or a combination of more materials selected from Si, $SiO_2$, $Si_3N_4$, poly-Si, PZT. Preferably, the vibration plate may form a membrane structure. In this way, the vibration plate has increased vibration efficiency.

Preferably, the piezoelectric element may be a single layer of thin film piezoelectric element, or two or more layers of thin film piezoelectric elements disposed in a laminated manner. Preferably, the thin film piezoelectric element may have a thickness of less than 5 µm. Preferably, the two or more layers of thin film piezoelectric elements may be configured to actuate the vibration plate in the same direction. In this way, with the combination of the two or more layers of thin film piezoelectric elements, the vibration plate has increased vibration efficiency.

Preferably, the piezoelectric element may comprise a piezoelectric layer and electrodes arranged on upper and lower sides of the piezoelectric layer. In other words, the piezoelectric layer and the electrodes are alternately disposed, such that the device can be driven by a drive voltage. Preferably, the piezoelectric element may comprise at least two piezoelectric layers, and any two adjacent piezoelectric layers share the electrode disposed there-between.

Preferably, the piezoelectric element may further have at least one extending portion extending beyond an edge of the pressure chamber and cover the pressure chamber forming layer.

Preferably, the piezoelectric element may further have at least two extending portions oppositely arranged.

Preferably, the pressure chamber may have a length greater than a width thereof, and the extending portion extends in a direction parallel to the width direction of the pressure chamber.

The piezoelectric device of the present invention can be widely applied to MEMS structure inkjet, micro pump, micro mirror, PMUT and the like as the drive element, taking the piezoelectric element as the actuator for driving the vibration plate to displace so as to change the volume of the pressure chamber. The piezoelectric device of the present invention can efficiently actuate the vibration plate, eliminate undesired displacements of the vibration plate in the opposite direction at the edge of the chamber, and provide higher displacement sensitivity to driving voltage.

BRIEF DESCRIPTION OF THE DRAWINGS

The present invention can be better understood with reference to the accompanying drawings and the following descriptions.

DETAILED DESCRIPTION OF ILLUSTRATED EMBODIMENTS

Figure 1A:
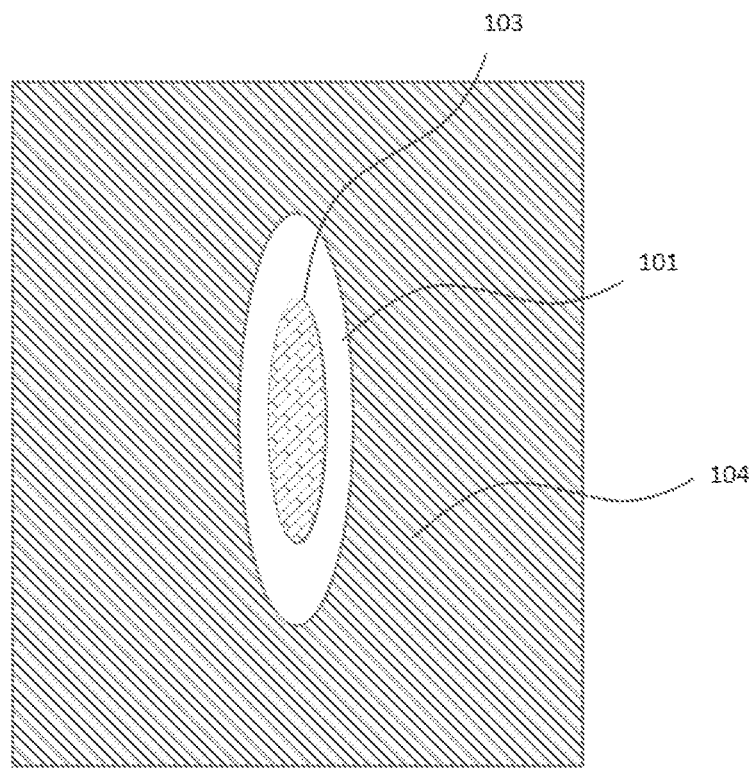
FIG. 1A is a schematic top view of a conventional piezoelectric device.
Figure 1B:
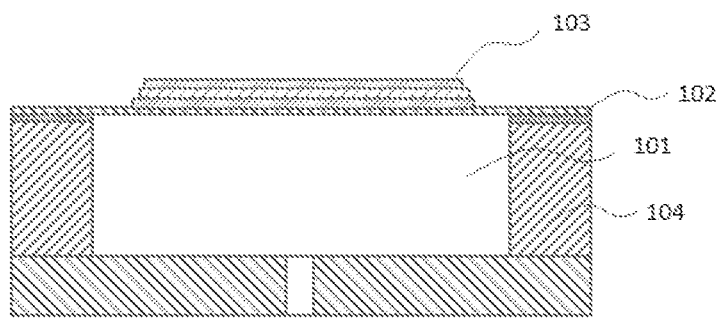
FIG. 1B is a longitudinal section view of a conventional piezoelectric device.
Figure 1C:
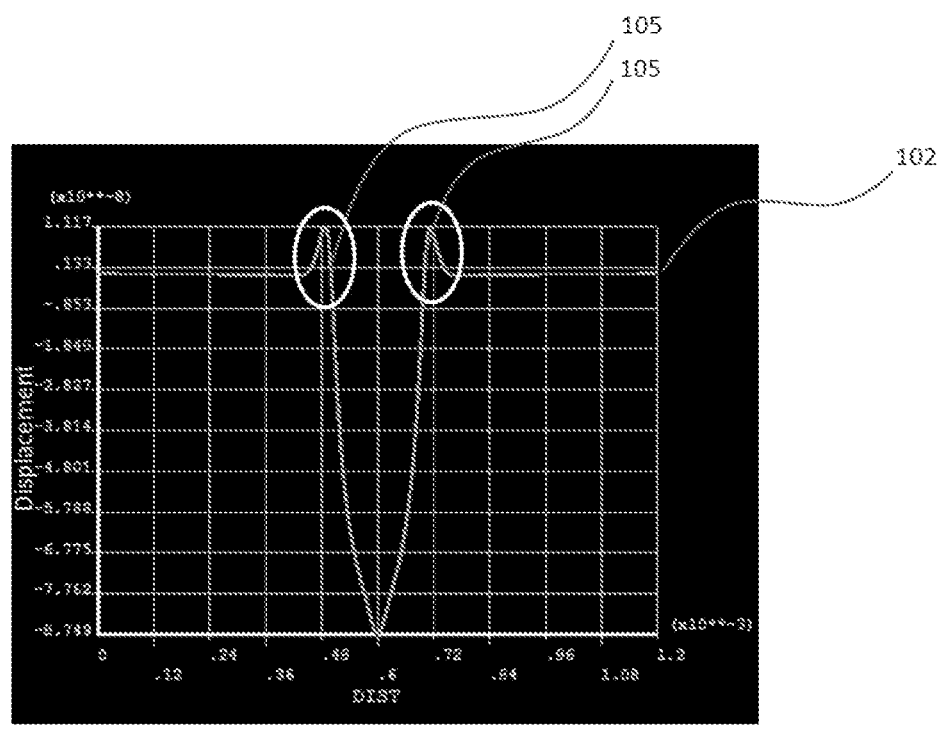
FIG. 1C is a schematic view illustrating displacement detection results of a conventional piezoelectric device.

Technical solutions according to various embodiments of the present invention will be clearly and completely described in conjunction with the accompanying drawings illustrating particular embodiments of the present invention.

Referring to FIGS. 2A, 2B, 2C and FIGS. 3-4, a piezoelectric device according to an embodiment of the present invention comprises a pressure chamber forming layer (204, 304, 404), a vibration plate (202) disposed on and connected with the pressure chamber forming layer (204, 304, 404) to form a pressure chamber (201, 301, 401), and a piezoelectric element (203, 303, 403) which is disposed on the vibration plate (202) and used for driving the vibration plate to move and thus changing a volume of the pressure chamber.

Herein, the piezoelectric element (203, 303, 403) is disposed on the vibration plate (202, 302, 402) in such a manner as to cover a portion of the pressure chamber (201, 301, 401), wherein the piezoelectric element (203, 303, 403) has two opposite ends (2033, 3033, 4033) respectively extend beyond the edge of the pressure chamber (201, 301, 401) and cover the pressure chamber forming layer (204, 304, 404).

Referring to FIGS. 2A, 2B, 2C, and 2D, for example, the piezoelectric device in the present embodiment mainly comprises a pressure chamber forming layer 204, a pressure chamber 201, a vibration plate 202 and a piezoelectric element 203.

The vibration plate 202 is arranged above the pressure chamber forming layer 204 and is connected with the pressure chamber forming layer 204 to form the pressure chamber 201. In particular, the pressure chamber 201 is defined by the vibration plate 202, the pressure chamber forming layer 204 and a substrate 205. Herein, the pressure chamber forming layer 204 constitutes the side wall of the pressure chamber 201, the pressure chamber 201 is formed above the substrate 205, the top of the pressure chamber 201 is covered by the vibration plate 202 such that the vibration plate 202 constitutes a portion of the pressure chamber 201.

In order to change the volume of the pressure chamber 201, the piezoelectric element 203 serves as a piezoelectric actuator to drive the vibration plate 202 to move. In particular, the piezoelectric element 203 disposed on the vibration plate 202 can drive the vibration plate 202 to move towards or away from the pressure chamber 201. When the vibration plate 202 is actuated by the piezoelectric element 203 to move in a direction away from the pressure chamber 201 due to the applying of drive voltage, the volume of the pressure chamber 201 increases and the pressure inside the pressure chamber 201 decreases, such that the outside liquid can enter into the pressure chamber 201 as needed. When the vibration plate 202 is actuated by the piezoelectric element 203 to move towards the pressure chamber 201, the volume of the pressure chamber 201 decreases and the pressure inside the pressure chamber 201 increases, such that the liquid inside the pressure chamber 201 may be ejected through the liquid nozzle. With such arrangement, the piezoelectric element 203 may be deformed to expand or contract due to the applying of different electrical fields, thereby driving the vibration plate 202 to move upwards or downwards, i.e., to move towards or away from the pressure chamber 201, and thus changing the volume of the pressure chamber 201.

Figure 2A:
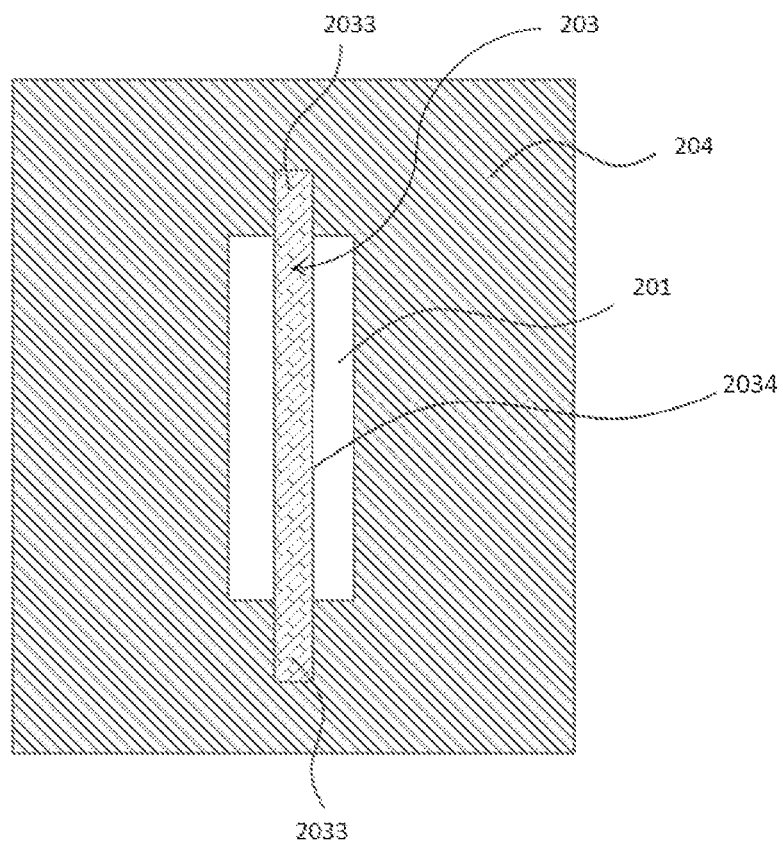
FIG. 2A is a schematic top view of a piezoelectric device according to a first embodiment of the present invention.
Figure 2B:
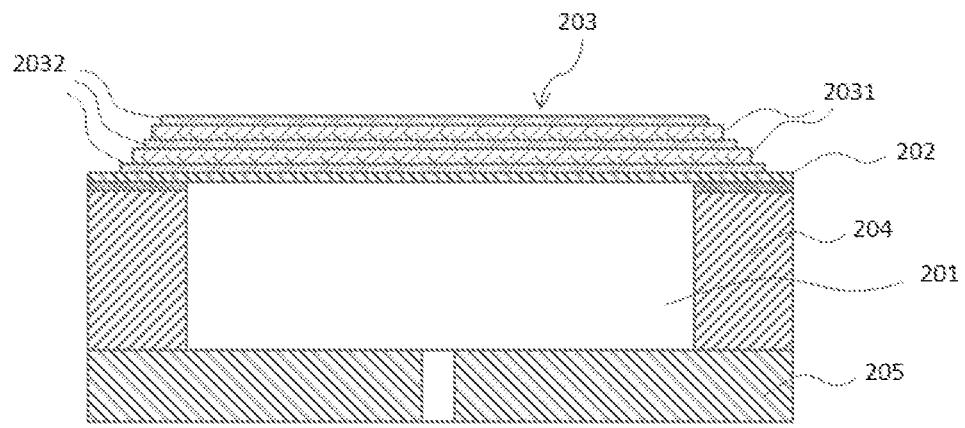
FIG. 2B is a longitudinal section view of the piezoelectric device shown in FIG. 2A.
Figure 2C:
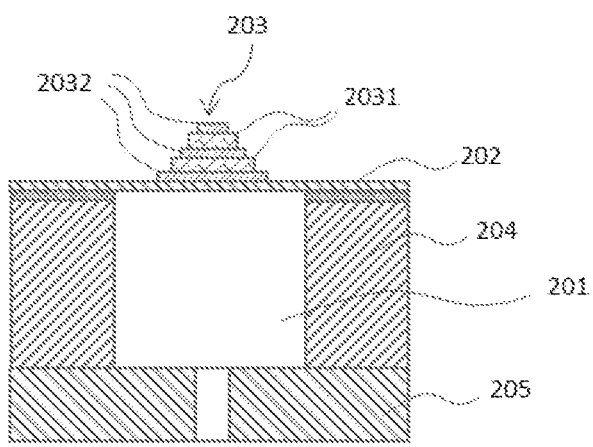
FIG. 2C is a widthwise section view of the piezoelectric device shown in FIG. 2A.

Referring to FIGS. 2A, 2B, and 2C, the pressure chamber 201 is fully covered by the vibration plate 202, and the piezoelectric element 203 disposed on the vibration plate 202 covers a portion of the vibration plate 202 and thus covers a portion of the pressure chamber 201.

In order to suppress or eliminate undesired displacements of the vibration plate 202 in the opposite direction, the piezoelectric element 203 is arranged in such a manner that:

at least two opposite ends 2033 of the piezoelectric element 203 respectively extend beyond two opposite edge portions of the pressure chamber 201 and cover the pressure chamber forming layer 204 from above and thus can be efficiently held by the pressure chamber forming layer 204.

Figure 2D:
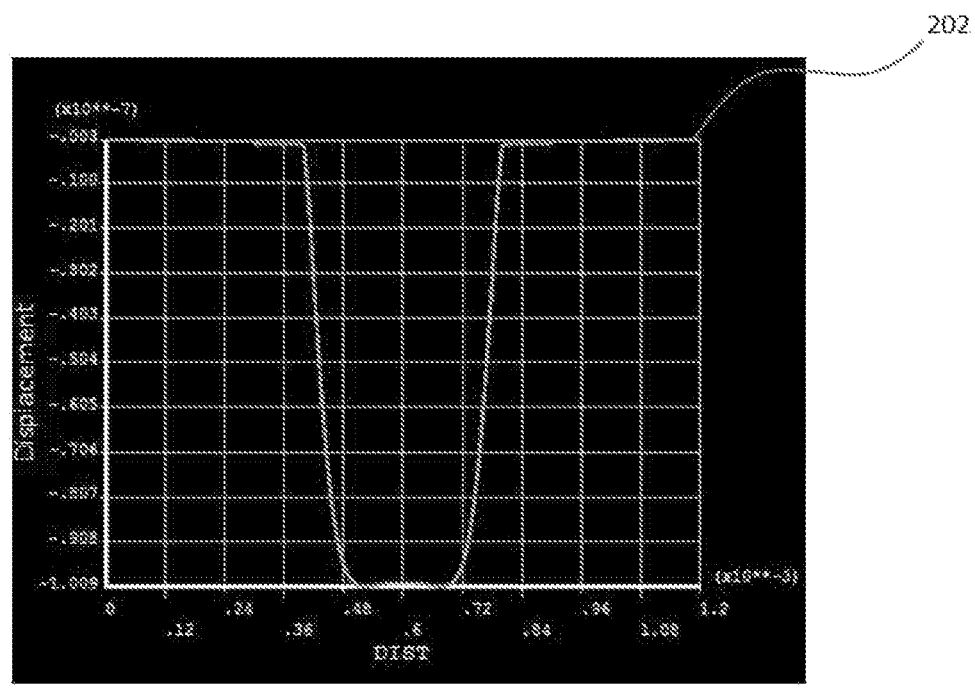
FIG. 2D is a schematic view illustrating displacement detection results of the piezoelectric device shown in FIG. 2A.

In such case, two ends 2033 of the piezoelectric element 203 which cover the pressure chamber forming layer 204 from above can be efficiently held by the pressure chamber forming layer 204. In this way, when the piezoelectric element 203 is deformed to expand or contract due to the applying of the electrical field, the whole piezoelectric element 203 can be deformed integrally, the edge portions of the piezoelectric element 203 at two ends have no displacement in the opposite direction, and the vibration plate 202 is integrally driven to move in the same direction. Referring to FIG. 2D, as the piezoelectric element 203 is deformed to expand or contract, the whole vibration plate 202 is driven to move upwards or downwards. In such case, the edge portions of the vibration plate 202 which are covered by the two ends of the piezoelectric element 203 can be held and constrained by the pressure chamber forming layer 204 and thus will not be displaced in the opposite direction, whereby the displacement sensitivity can be increased.

In the case that the vibration plate is a part of a liquid jetting chamber such as an ink chamber in a jet printing head, the piezoelectric device of the present invention can provide good ink ejecting performance since the effective and precise vibration plate movement can lead to high effectiveness of volume change of the ink chamber, which is positive for better ink ejecting.

Figure 3:
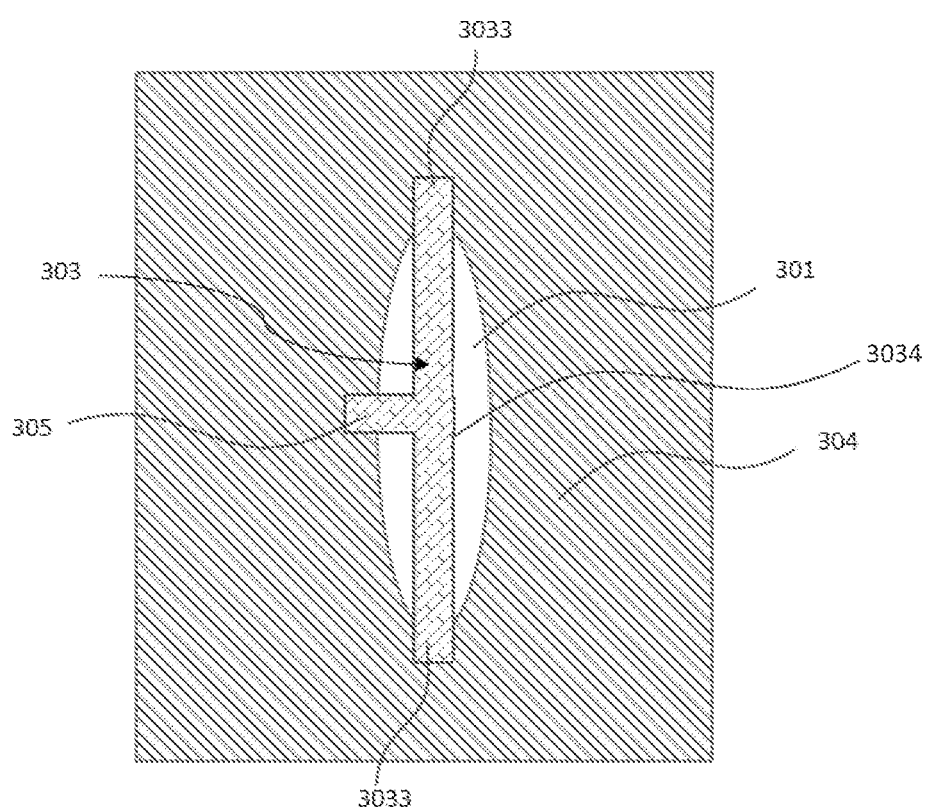
FIG. 3 is a schematic top view of a piezoelectric device according to a second embodiment of the present invention.
Figure 4:
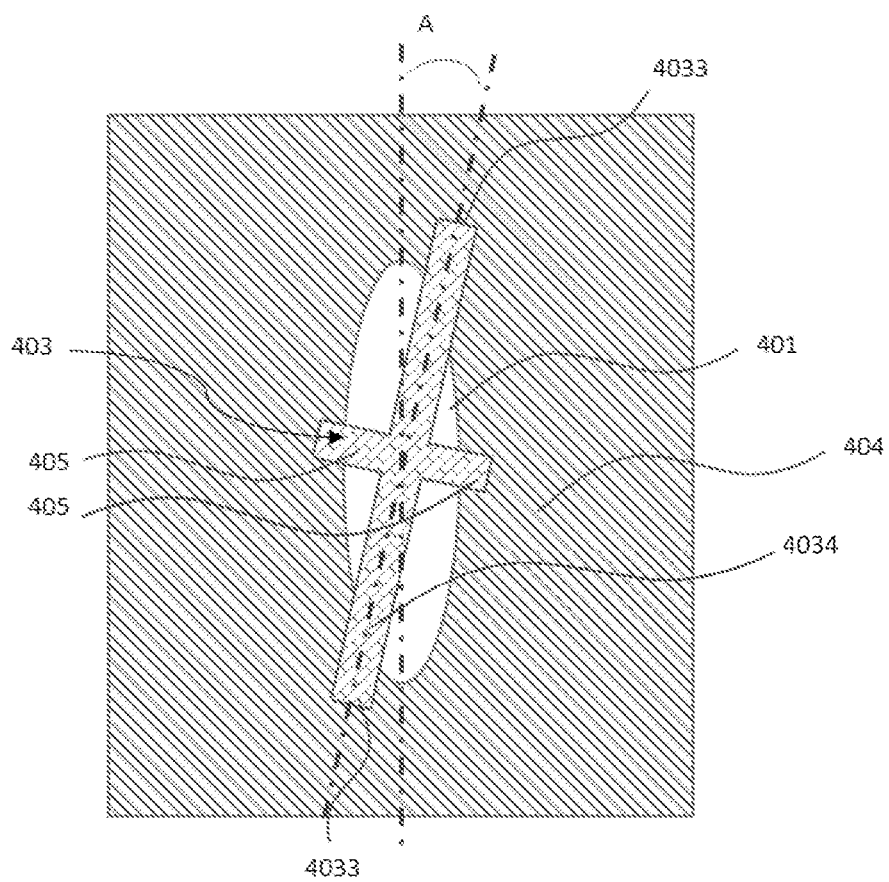
FIG. 4 is a schematic top view of a piezoelectric device according to a third embodiment of the present invention.

In one set of preferred embodiments, as shown in FIGS. 2A, 3, and 4, the pressure chamber (201, 301, 401) has a length greater than a width thereof, and a connecting line (2034, 3034, 4034) connecting two opposite ends (2033, 3033, 4033) and the width direction of the pressure chamber (201, 301, 401) form an angle greater than zero.

Referring to FIG. 2A, for example, a connecting line 2034 connecting two opposite ends 2033 of the piezoelectric element 203 is not parallel to the width direction of the pressure chamber 201, and the line and the width direction of the pressure chamber 201 form a non-zero angle or an angle greater than zero. In this way, undesired displacements of the vibration plate in the opposite direction can be eliminated in the direction along the connecting line 2034 connecting two opposite ends 2033 or in a direction parallel to any direction except for the width direction of the pressure chamber.

In one set of preferred embodiments, as shown in FIGS. 2A and 3, a connecting line (2034, 3034) connecting two opposite ends (2033, 3033) is parallel to the length direction of the pressure chamber (201, 301). In this way, since the movement performance of the whole vibration plate is more of longitudinal feature dominated, undesired displacements of the vibration plate in the opposite direction are basically eliminated, and the displacement sensitivity of the whole vibration plate can be increased.

Referring to FIG. 4, in a preferred embodiment, a connecting line 4034 connecting two opposite ends 4033 and the length direction of the pressure chamber 401 form an angle A less than 20 degrees. In the case that the pressure chamber 401 has a length greater than a width thereof, the directions of the lines connecting two opposite ends 4033 include, but are not limited to, the directions parallel to the length direction of the pressure chamber, and further include all directions which form an angle greater than zero with the width direction of the pressure chamber. In particular, when the connecting line 4034 connecting the two ends 4033 is in a direction which forms an angle less than 20 degrees with the length direction of the pressure chamber 401, undesired displacements of the vibration plate in the opposite direction may be better eliminated.

Preferably, referring to FIGS. 2A, 3, and 4, the pressure chamber (201, 301, 401) may be elongated or oval shaped. In particular, the cross section or top view of the pressure chamber (201, 301, 401) may be rectangle, oval, or any other shapes which are long and narrow, to meet various shape requirements.

Preferably, the piezoelectric element (203, 303, 403) may cover a central point of the pressure chamber (201, 301, 401). In such case, undesired displacements of the vibration plate may be eliminated to a great extent.

Preferably, the piezoelectric element (203, 303, 403) may be disposed in a middle position with respect to the width direction of the pressure chamber (201, 301, 401). In such case, undesired displacements of the vibration plate may be better eliminated.

Preferably, the pressure chamber (201, 301, 401) may have a length greater than a width thereof, and the piezoelectric element (203, 303, 403) may be arranged in such a manner that a connecting line (2034, 3034) connecting two opposite ends (2033, 3033) is parallel to the length direction of the pressure chamber (201, 301) and the piezoelectric element (203, 303, 403) is disposed in a middle position with respect to the width direction of the pressure chamber (201, 301, 401). In such case, undesired displacements of the vibration plate may be better eliminated.

In one set of preferred embodiments, the pressure chamber may have a length equal to a width thereof, i.e., the cross section is a square or a circle. In such case, two opposite ends of the piezoelectric element may respectively extend beyond the edge of the pressure chamber in any direction, to eliminate undesired displacements of the vibration plate.

Preferably, the pressure chamber may have a length greater than a width thereof, the piezoelectric element extend in a direction parallel to the length direction of the pressure chamber, and further, the piezoelectric element is disposed in a middle position with respect to the width direction of the pressure chamber, undesired displacements of the vibration plate in the opposite direction may be eliminated to a great extent.

Preferably, the vibration plate 202 may be made from anyone or a combination of more materials selected from Si, $SiO_2$, $Si_3N_4$, poly-Si, PZT.

In one set of preferred embodiments, the vibration plate 202 may form a membrane structure. In the case that the membrane structure is a part of a liquid jetting chamber such as an ink chamber in a jet printing head, as the membrane structure is displaced towards the chamber, the volume of the chamber will decrease and the ink in the chamber will be ejected through the nozzle in communication with the chamber. The membrane displacement sensitivity to driving voltage is highly related to the configuration of the thin film piezoelectric element on top of the membrane.

In one set of preferred embodiments, the piezoelectric element (203, 303, 403) may be a single layer thin film piezoelectric element, or two-layer or multi-layer thin film piezoelectric element arranged in a laminated manner. In other words, the piezoelectric element (203, 303, 403) may be made of a single layer of thin film piezoelectric element, or made of two or more layers of thin film piezoelectric elements disposed in a laminated manner. In practice, the thin film piezoelectric element may have a thickness of preferably less than 5 μm.

In an embodiment, the piezoelectric element (203, 303, 403) may be made of two or more layers of thin film piezoelectric elements disposed in a laminated manner, and the two or more layers of thin film piezoelectric elements are configured to actuate the vibration plate (202) in the same direction. In particular, the layers of thin film piezoelectric elements may be configured to actuate the vibration plate (202) in the same direction by wiring of the thin film piezoelectric elements or providing wiring for the thin film piezoelectric elements.

In one set of preferred embodiments, the piezoelectric element 203 may comprise a piezoelectric layer 2031 and electrodes 2032 arranged on upper and lower sides of the piezoelectric layer 2031.

Preferably, the piezoelectric element 203 may comprise at least two piezoelectric layers 2031, and any two adjacent piezoelectric layers 2031 can share the electrode 2032 disposed there-between. In particular, referring to FIGS. 2B and 2C, the piezoelectric element 203 comprises two piezoelectric layers 2031 and three electrodes 2032 which are respectively and alternately disposed on respective two sides of the two piezoelectric layers 2031. That is, between each two adjacent piezoelectric layers 2031, one electrode 2032 is disposed, to facilitate sharing. In this way, the device can be driven by a voltage.

In one set of preferred embodiments, referring to FIGS. 3-4, the piezoelectric element (303, 403) may further have at least one extending portion (305, 405) extending beyond the edge of the pressure chamber (301, 401) and cover the pressure chamber forming layer (304, 404). In such case, the extending portion (305, 405) can be efficiently held and constrained by the pressure chamber forming layer (304, 404) located below, and the piezoelectric element can be constrained in a further direction, whereby undesired displacements of the piezoelectric element and of the vibration plate in the opposite direction may be better eliminated, and the displacement sensitivity can be increased.

In particular, the extending portion 305 extends beyond the edge of the pressure chamber 301 and covers the pressure chamber forming layer 304, such that the extending portion 305 can be efficiently held and constrained by the pressure chamber forming layer 304 located below, as shown in FIG. 3. As shown in FIG. 4, the extending portion 405 extends beyond the edge of the pressure chamber 401 and covers the pressure chamber forming layer 404, such that the extending portion 405 can be efficiently held and constrained by the pressure chamber forming layer 404 located below.

Referring to FIG. 4, in a preferred embodiment, the piezoelectric element 403 may have at least two oppositely arranged extending portions 405, wherein the two extending portions 405 are oppositely arranged on the two sides of the piezoelectric element 403 and are integrally formed with the piezoelectric element 403, the two extending portions 405 both extend beyond the edge of the pressure chamber 401 and cover the pressure chamber forming layer 404, such that the both two extending portions 405 can be efficiently held and constrained by the pressure chamber forming layer 404, whereby undesired displacements of the piezoelectric element and of the vibration plate in the opposite direction may be better eliminated.

Referring to FIG. 3, in a preferred embodiment, the pressure chamber 301 may have a length greater than a width thereof, and the extending portion 305 extends in a direction parallel to the width direction of the pressure chamber 301. In such case, undesired displacements of the piezoelectric element and of the vibration plate in the opposite direction are suppressed or eliminated in the width direction, and undesired displacements may be better eliminated.

It should be understood that, whilst the disclosed embodiments are described by taking the inkjet printing head as an example and using the thin film piezoelectric element as the actuator for driving the membrane structure, the device of the present invention can also be applied to other liquid-jet heads, micro pump, micro mirror, PMUT, and the like, taking the piezoelectric element as the actuator for driving the vibration plate to move so as to change the volume of the pressure chamber.

It should be understood that the terms, such as "upper" and "lower" as used in the description, refer to position and orientation relationships in accordance with drawings for convenience of description and for the purpose of simplicity. They are not intended to indicate or hint a limitation in terms of specific orientation or configuration and operation with specific orientation to the described device or element and should not be regarded as limiting.

All the above are merely some preferred embodiments of the present invention, but are not to limit the scope of the invention in any form. The present invention is intended to cover all changes and equivalent arrangements included within the scope of the present invention.

What is claimed is:
1. A piezoelectric device, comprising:
a pressure chamber forming layer, a vibration plate disposed on the pressure chamber forming layer and connected with the pressure chamber forming layer to form a pressure chamber, and a piezoelectric element disposed on the vibration plate and used for driving the vibration plate to move and changing a volume of the pressure chamber,
wherein the piezoelectric element is disposed on the vibration plate in such a manner as to only partially cover the pressure chamber, and
the piezoelectric element has two opposite ends that are opposite to each other in a length direction of the piezoelectric element, and the two opposite ends respectively extending beyond two opposite edge portions of the pressure chamber and covering a portion of the pressure chamber forming layer,
wherein a width of each of the two opposite ends of the piezoelectric element is smaller than a width of the pressure chamber so that a portion of the pressure chamber is uncovered by the piezoelectric element, and a connecting line connecting the two opposite ends is not parallel to a width direction of the pressure chamber.

2. The piezoelectric device according to claim 1, wherein the pressure chamber has a length greater than the width thereof.

3. The piezoelectric device according to claim 2, wherein the connecting line connecting the two opposite ends is parallel to the length direction of the pressure chamber.

4. The piezoelectric device according to claim 2, wherein the connecting line connecting the two opposite ends and the length direction of the pressure chamber form an angle less than 20 degrees.

5. The piezoelectric device according to claim 2, wherein the pressure chamber has an elongated or oval-shaped cross section.

6. The piezoelectric device according to claim 1, wherein the pressure chamber has a length equal to the width thereof.

7. The piezoelectric device according to claim 6, wherein the pressure chamber has a square-shaped or a circle cross section.

8. The piezoelectric device according to claim 1, wherein the piezoelectric element covers a central point of the pressure chamber.

9. The piezoelectric device according to claim 1, wherein the vibration plate comprises one or more of Si, SiO2, Si3N4, poly-Si, or PZT.

10. The piezoelectric device according to claim 1, wherein the vibration plate forms a membrane structure.

11. The piezoelectric device according to claim 1, wherein the piezoelectric element comprises a single layer of thin film piezoelectric element, or two or more layers of thin film piezoelectric elements disposed in a laminated manner.

12. The piezoelectric device according to claim 11, wherein the thin film piezoelectric element has a thickness of less than 5 μm.

13. The piezoelectric device according to claim 11, wherein the two or more layers of thin film piezoelectric elements are configured to actuate the vibration plate in a same direction.

14. The piezoelectric device according to claim 1, wherein the piezoelectric element comprises a piezoelectric layer and electrodes arranged on upper and lower sides of the piezoelectric layer.

15. The piezoelectric device according to claim 14, wherein the piezoelectric element comprises at least two piezoelectric layers, and any two adjacent piezoelectric layers share the electrode disposed there-between.

16. The piezoelectric device according to claim 1, wherein the piezoelectric element further has at least one extending portion extending beyond an edge portion of the pressure chamber and covering a portion of the pressure chamber forming layer.

17. The piezoelectric device according to claim 16, wherein the piezoelectric element further has at least two extending portions oppositely arranged.

18. The piezoelectric device according to claim 16, wherein the pressure chamber has a length greater than the width thereof, and the extending portion extends in a direction parallel to the width direction of the pressure chamber.

19. The piezoelectric device according to claim 17, wherein the pressure chamber has a length greater than the width thereof, and the extending portion extends in a direction parallel to the width direction of the pressure chamber.

20. The piezoelectric device according to claim 2, wherein the piezoelectric element covers a central point of the pressure chamber.

* * * * *